(12) United States Patent
Park

(10) Patent No.: US 8,039,841 B2
(45) Date of Patent: Oct. 18, 2011

(54) ORGANIC LIGHT EMITTING DIODE DISPLAY

(75) Inventor: Seung-Kyu Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 31 days.

(21) Appl. No.: 12/347,053

(22) Filed: Dec. 31, 2008

(65) Prior Publication Data

US 2010/0025664 A1  Feb. 4, 2010

(30) Foreign Application Priority Data

Jul. 29, 2008  (KR) .................. 10-2008-0073936

(51) Int. Cl.
H01L 27/32 (2006.01)
H01L 51/50 (2006.01)
(52) U.S. Cl. ............. 257/59; 257/40; 257/E51.022; 257/E33.001; 438/34
(58) Field of Classification Search ............ 257/40, 257/59, E51.018, E51.022, E33.001, E33.055, 257/E33.062; 438/34
See application file for complete search history.

(56) References Cited

U.S. PATENT DOCUMENTS

| 7,692,191 | B2 * | 4/2010 | Kwak et al. ............... 257/59 |
| 2002/0041281 | A1 * | 4/2002 | Yanagi et al. ............. 345/212 |
| 2002/0149724 | A1 * | 10/2002 | Kawachi et al. ........... 349/113 |
| 2005/0134770 | A1 * | 6/2005 | Choi ....................... 349/114 |
| 2006/0001366 | A1 * | 1/2006 | Chung et al. ............. 313/506 |
| 2006/0244696 | A1 * | 11/2006 | Jung et al. ................ 345/77 |
| 2007/0264899 | A1 * | 11/2007 | Kumagai .................. 445/24 |
| 2007/0295961 | A1 * | 12/2007 | Kim ......................... 257/40 |
| 2008/0006827 | A1 * | 1/2008 | Shim et al. ............... 257/72 |
| 2008/0100228 | A1 * | 5/2008 | Park ....................... 315/169.3 |
| 2008/0309233 | A1 * | 12/2008 | Hasegawa et al. ......... 313/505 |
| 2009/0079921 | A1 * | 3/2009 | Mori et al. ............... 349/114 |
| 2009/0102996 | A1 * | 4/2009 | Chen et al. .............. 349/43 |

FOREIGN PATENT DOCUMENTS

| JP | 2005062400 | 3/2005 |
| JP | 2006278257 | 10/2006 |
| JP | 2007066774 | 3/2007 |
| JP | 2007234581 | 9/2007 |
| KR | 100600882 | 7/2006 |
| KR | 1020070004718 | 1/2007 |
| KR | 100685424 | 2/2007 |
| KR | 100696491 | 3/2007 |
| KR | 1020070079946 | 8/2007 |

* cited by examiner

Primary Examiner — Matthew Smith
Assistant Examiner — Michele Fan
(74) Attorney, Agent, or Firm — Cantor Colburn LLP

(57) ABSTRACT

An organic light-emitting diode ("OLED") display includes a first thin film transistor disposed on a substrate; a first insulating layer disposed on the first thin film transistor; a reflective electrode disposed on the first insulating layer; a common voltage line disposed on the first insulating layer and separated from the reflective electrode; a second insulating layer disposed on the reflective electrode and the common voltage line; a pixel electrode disposed on the second insulating layer and electrically connected to the first thin film transistor; an organic light-emitting member disposed on the pixel electrode; and a common electrode disposed on the organic light-emitting member, wherein the common voltage line is electrically connected to the common electrode.

14 Claims, 17 Drawing Sheets

ORGANIC LIGHT EMITTING DIODE DISPLAY

This application claims priority to Korean Patent Application No. 10-2008-0073936, filed on Jul. 29, 2008, and all the benefits accruing therefrom under 35 U.S.C. §119, the contents of which in its entirety are herein incorporated by reference.

BACKGROUND OF THE INVENTION (1) Field of the Invention

This disclosure relates to an organic light-emitting diode ("OLED") display.

(2) Description of the Related Art

An OLED display includes a plurality of organic light-emitting elements and a plurality of thin film transistors ("TFT"s), which control the organic light-emitting elements. A TFT includes a plurality of thin films and can be disposed at a lower side of an OLED display, while an organic light-emitting element can be disposed at an upper side of the OLED display. An anode of the organic light-emitting element can be disposed at the lower side of the OLED display, and a cathode of the organic light-emitting element can be disposed at the upper side of the OLED display.

An OLED display may be classified as a top emission type, which emits light upward, and a bottom emission type, which emits light downward. In a bottom emission OLED display, an area where light is emitted is decreased due to the TFTs disposed under the organic light-emitting elements, therefore the top emission type can have a more desirable aperture ratio. Also, a bottom emission OLED display can include a spot due to optical interference, which can occur when light passes through the thin films. A top emission OLED display includes very few thin films on the light path, thus substantially reducing or preventing a spot.

Identifying a suitable transparent material that satisfies the work function requirements for a cathode in a top emission OLED display is difficult. Therefore a very thin film of an opaque metal can be disposed for use as the cathode while allowing for the passage of light. A resistance of a very thin film cathode can be large. To address the high resistance of a thin film cathode, an additional common voltage line for transmitting a common voltage can be disposed on the substrate and electrically connected to the cathode of the organic light-emitting element.

However, manufacturing a common voltage line separately from the cathode can be difficult, and an aperture ratio may be reduced due to the area occupied by the common voltage line.

BRIEF SUMMARY OF THE INVENTION

The above described and other drawbacks are alleviated by an organic light-emitting diode ("OLED") display including: a first thin film transistor disposed on a substrate; a first insulating layer disposed on the first thin film transistor; a reflective electrode disposed on the first insulating layer; a common voltage line disposed on the first insulating layer and separated from the reflective electrode; a second insulating layer disposed on the reflective electrode and the common voltage line; a pixel electrode disposed on the second insulating layer and electrically connected to the first thin film transistor; an organic light-emitting member disposed on the pixel electrode; and a common electrode disposed on the organic light-emitting member, wherein the common voltage line is electrically connected to the common electrode.

Also disclosed is an OLED wherein the second insulating layer has a first contact hole which exposes the common voltage line, and the common electrode is electrically connected to the common voltage line through the first contact hole.

Also disclosed is an OLED further including a second thin film transistor disposed under the first insulating layer, and a connection member disposed on the first insulating layer and electrically connecting the first thin film transistor and the second thin film transistor.

Also disclosed is an OLED wherein the pixel electrode overlaps the reflective electrode and the connection member.

Also disclosed is an OLED display further including a gate line and a data line disposed under the first insulating layer, the gate line and the data line electrically connected to the second thin film transistor, wherein the common voltage line overlaps the gate line and the data line. In an embodiment, the common voltage line overlaps the second thin film transistor.

Also disclosed is an OLED display further including a contact assistance member disposed on the second insulating layer, the contact assistance member contacting the common voltage line and the common electrode.

Also disclosed is an OLED wherein the common voltage line includes a net-like shape, and the reflective electrode is disposed in a region defined by the net-like shape.

Also disclosed is an OLED wherein the common electrode includes a metal.

In yet another exemplary embodiment, a method for manufacturing an OLED display includes: forming a thin film transistor including a control electrode, an input electrode, and an output electrode on a substrate; depositing a passivation layer on the thin film transistor; patterning the passivation layer to form a first contact hole which exposes the output electrode; forming a reflective electrode electrically connected to the output electrode through the first contact hole; forming a common voltage line separated from the reflective electrode and on the passivation layer; depositing an insulating layer on the reflective electrode and the common voltage line; patterning the insulating layer to form a second contact hole, which exposes a portion of the reflective electrode; and patterning the insulating layer to form a third contact hole, which exposes a portion of the common voltage line; forming a pixel electrode electrically connected to the reflective electrode through the second contact hole; forming an organic light-emitting member on the pixel electrode; and forming a common electrode electrically connected to the common voltage line through the third contact hole.

Also disclosed is a method for manufacturing an organic light-emitting diode display including: forming a thin film transistor including a control electrode, an input electrode, and an output electrode on a substrate; depositing a passivation layer on the thin film transistor; patterning the passivation layer to form a first contact hole, which exposes the output electrode, and a second contact hole, which exposes the input electrode; forming a reflective electrode electrically connected to the output electrode through the first contact hole; forming a driving voltage line electrically connected to the input electrode through the second contact hole; depositing an insulating layer on the reflective electrode and the driving voltage line; patterning the insulating layer to form a third contact hole which exposes a portion of the reflective electrode; forming a pixel electrode electrically connected to the reflective electrode through the through the third contact hole; forming an organic light-emitting member on the pixel electrode; and forming a common electrode on the organic light-emitting member and the insulating layer.

DETAILED DESCRIPTION OF THE INVENTION

Figure 1:
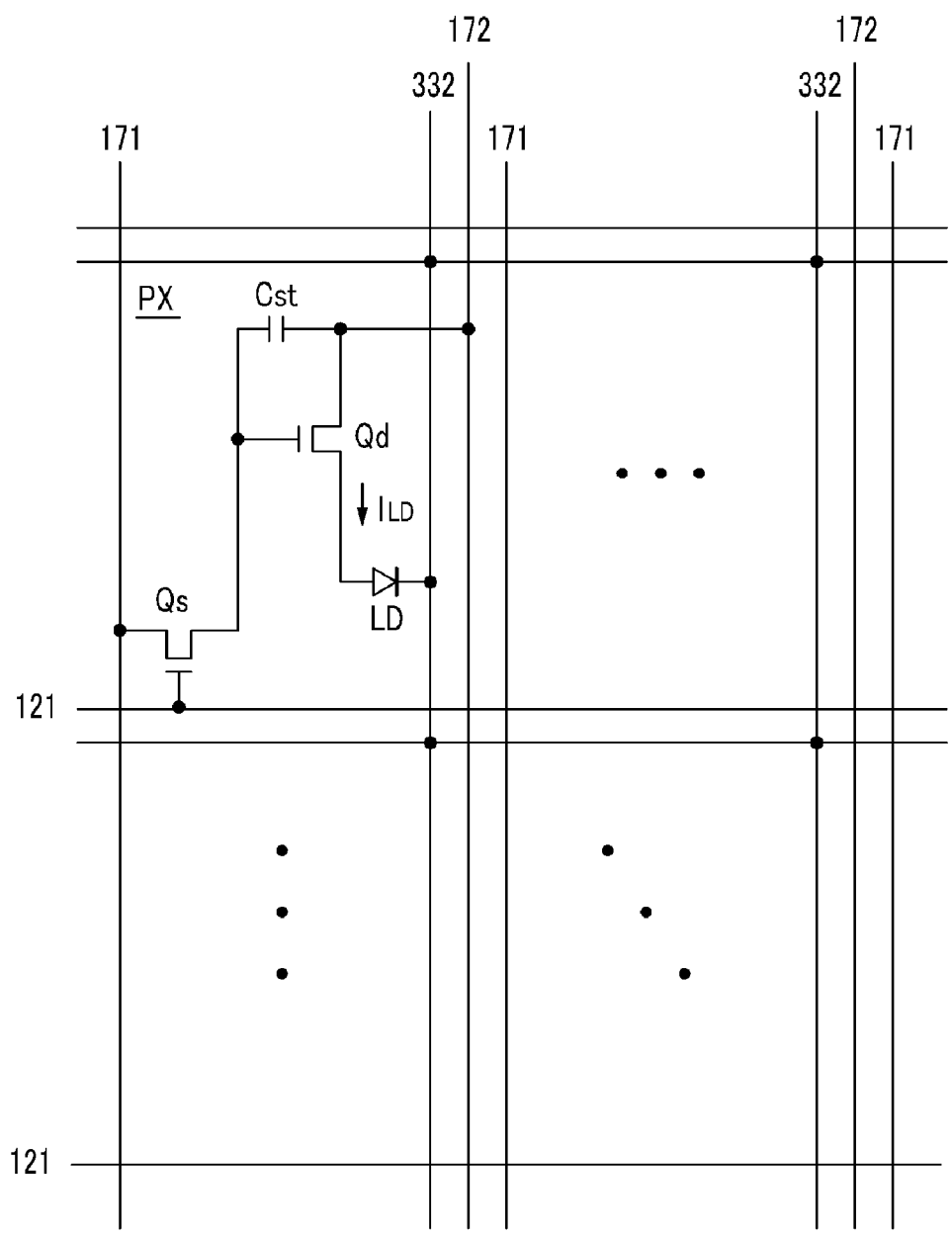
FIG. 1 is an equivalent circuit diagram showing an exemplary embodiment of an organic light-emitting diode ("OLED") display.

The invention will be described more fully hereinafter with reference to the accompanying drawings, in which exemplary embodiments are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present invention.

Spatially relative terms, such as "lower," "under," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "upper" or "over" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

The invention will be described more fully hereinafter with reference to the accompanying drawings, in which exemplary embodiments of the invention are shown.

An organic light-emitting diode ("OLED") display according to an exemplary embodiment is described in detail with reference to FIG. 1.

FIG. 1 is an equivalent circuit diagram showing an exemplary embodiment of an OLED display.

Referring to FIG. 1, an OLED display includes a plurality of signal lines 121, 171, 172, and 332, and a plurality of pixels PX electrically connected thereto and arranged substantially in a matrix.

The signal lines include a plurality of gate lines 121 for transmitting gate signals (or scanning signals), a plurality of data lines 171 for transmitting data signals, a plurality of first driving voltage lines 172 for transmitting a driving voltage, and a plurality of common voltage lines 332 for transmitting a common voltage. The gate lines 121 extend substantially in a row direction and are substantially parallel to each other, and the data lines 171 extend substantially in a column direction and are substantially parallel to each other. The first driving voltage lines 172 extend substantially in the column direction, and the common voltage lines 332 comprise a net-like shape, thus can form a network. The net-like shape can be analogous to that of the gate lines 121 and the data lines 171 shown in FIG. 1. In an embodiment, the common voltage lines 332 form a rectilinear network. Alternatively, the common voltage lines 332 may respectively extend in the row direction or the column direction.

Each pixel PX includes a switching transistor Qs, a driving transistor Qd, a storage capacitor Cst, and an organic light-emitting element LD.

The switching transistor Qs comprises a control terminal, which is electrically connected to a gate line 121, an input terminal, which is electrically connected to a data line 171, and an output terminal, which is electrically connected to the driving transistor Qd. The switching transistor Qs transmits a data signal applied from the data line 171 to the driving transistor Qd in response to a gate signal applied from the gate line 121.

The driving transistor Qd has a control terminal electrically connected to the switching transistor Qs, an input terminal electrically connected to the first driving voltage line 172, and an output terminal electrically connected to the organic light-emitting element. The driving transistor Qd drives an output current $I_{LD}$, which has a magnitude which depends on the voltage between the control terminal and the output terminal.

The storage capacitor Cst is electrically connected between the control terminal and the input terminal of the driving transistor Qd. The storage capacitor Cst stores a data voltage, which is also applied to the control terminal of the driving transistor Qd, and maintains the data voltage even after the switching transistor Qs turns off.

The organic light-emitting element LD, which can be an OLED, comprises an anode electrically connected to the output terminal of the driving transistor Qd, and a cathode electrically connected to the common voltage line 332. The organic light-emitting element LD emits light having an intensity which depends on an output current $I_{LD}$ of the driving transistor Qd, thereby displaying an image.

The switching transistor Qs and the driving transistor Qd can be an n-channel field effect transistor ("FET"), and may comprise the structure shown schematically in FIG. 1. However, a switching transistor Qs and the driving transistor Qd may also be a p-channel FET. In addition, the connections among the transistors Qs and Qd, the capacitor Cst, and the organic light-emitting element LD, may be different.

In another exemplary embodiment, other transistors for compensating the threshold voltage of the driving transistor Qd may be further included in addition to the switching transistor Qs and the driving transistor Qd.

An equivalent circuit diagram of an OLED display is shown in FIG. 1. The OLED display is further described with reference to FIG. 2 to FIG. 5, as well as FIG. 1.

Figure 2:
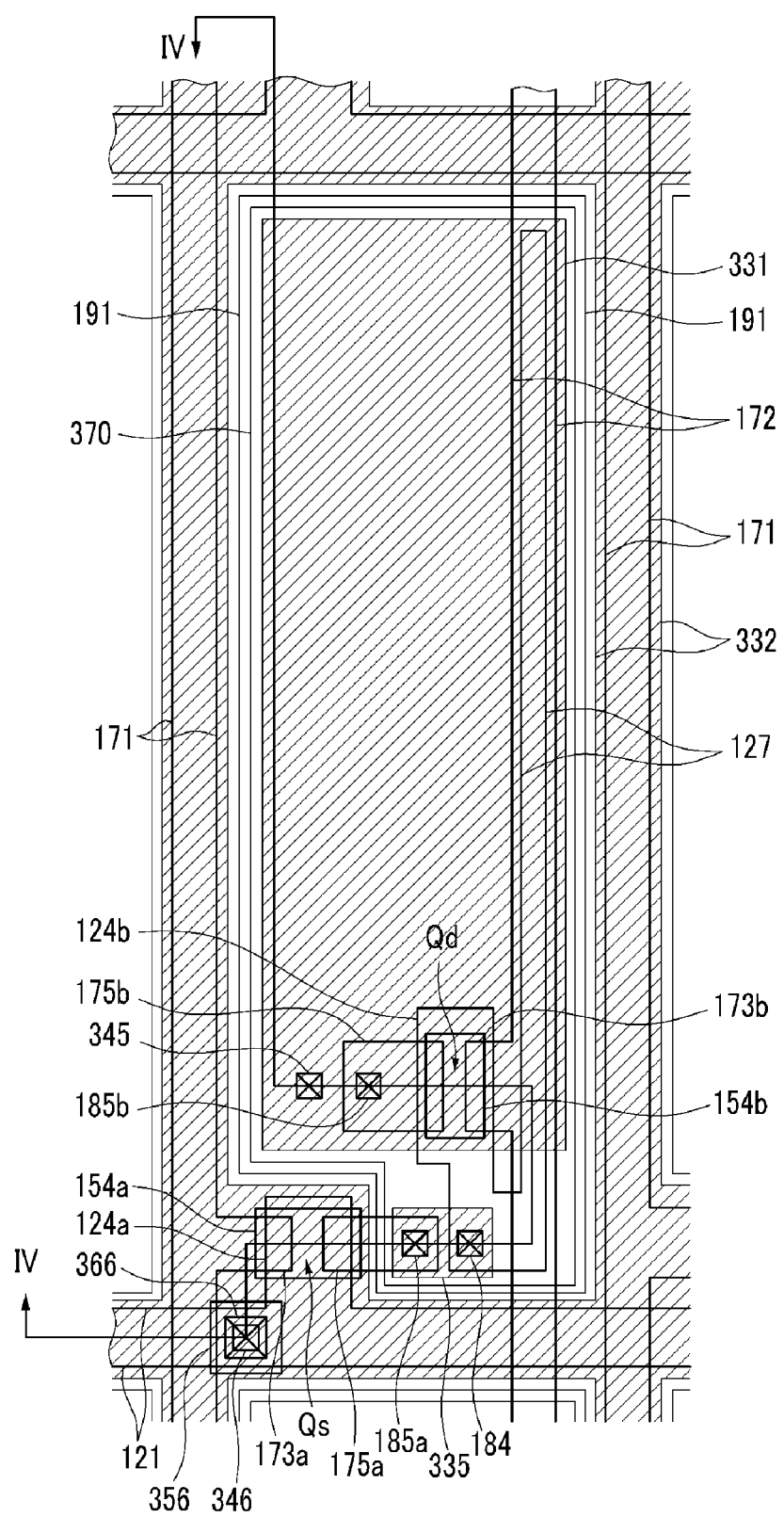
FIG. 2 is a plan view showing an exemplary embodiment of an OLED display.
Figure 3:
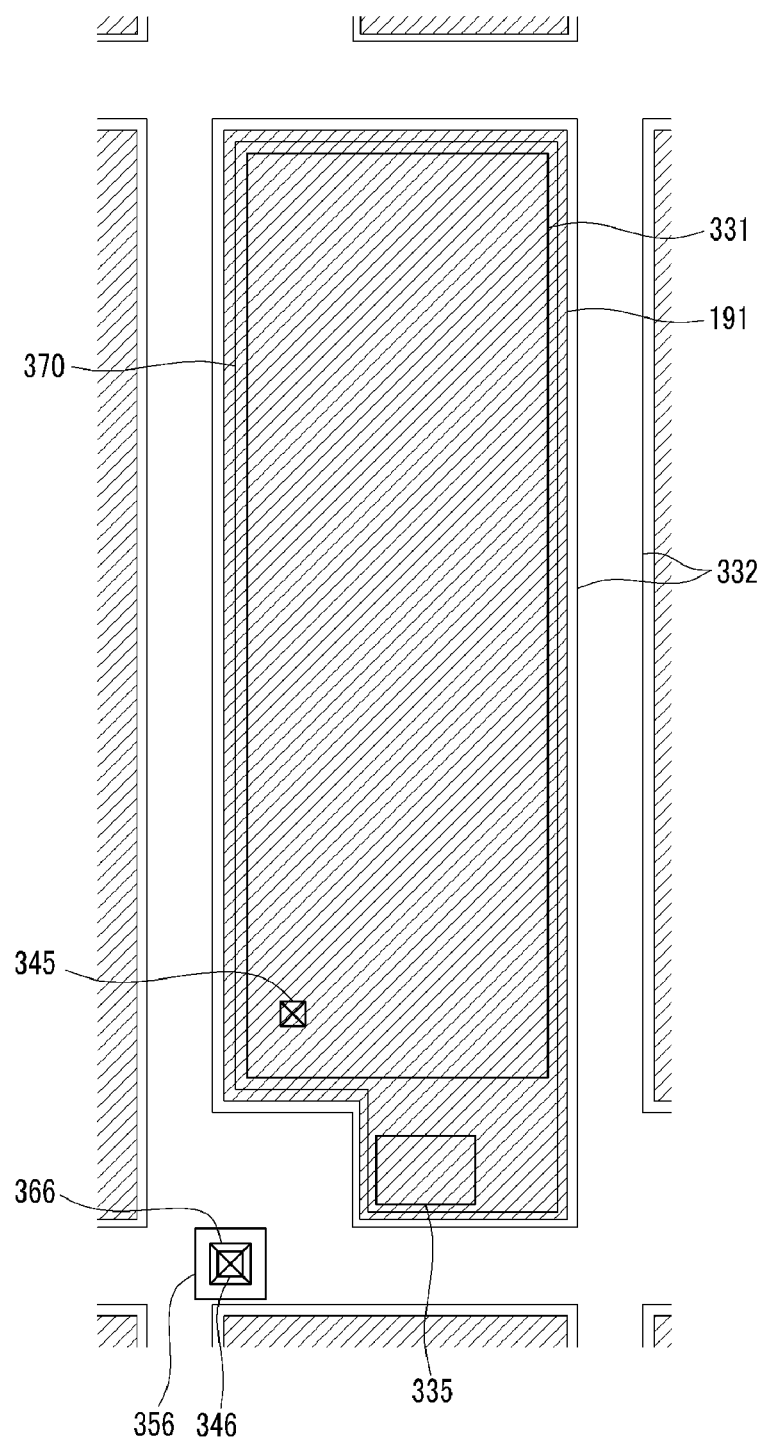
FIG. 3 is a plan view showing an exemplary embodiment of a portion of the OLED display shown in FIG. 2.
Figure 4:
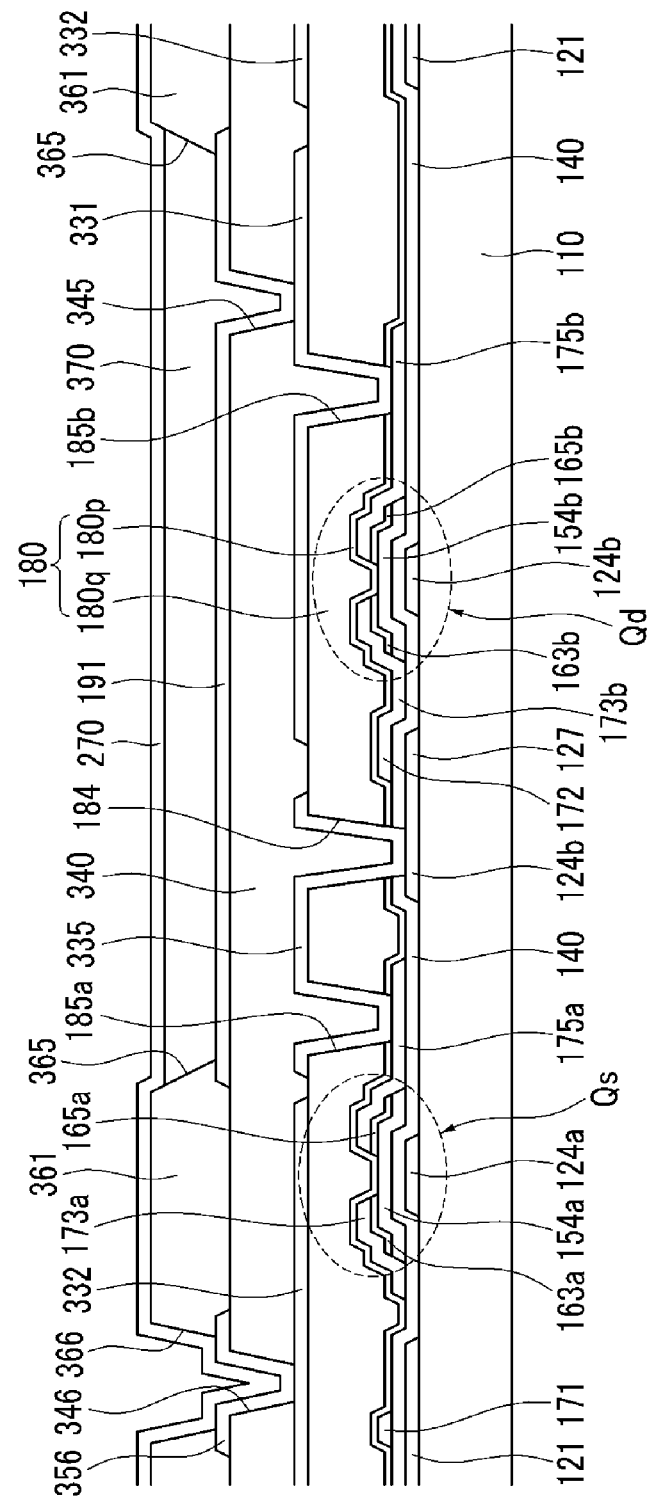
FIG. 4 is a cross-sectional view showing an exemplary embodiment of the OLED display shown in FIG. 2 taken along line IV-IV.
Figure 5:
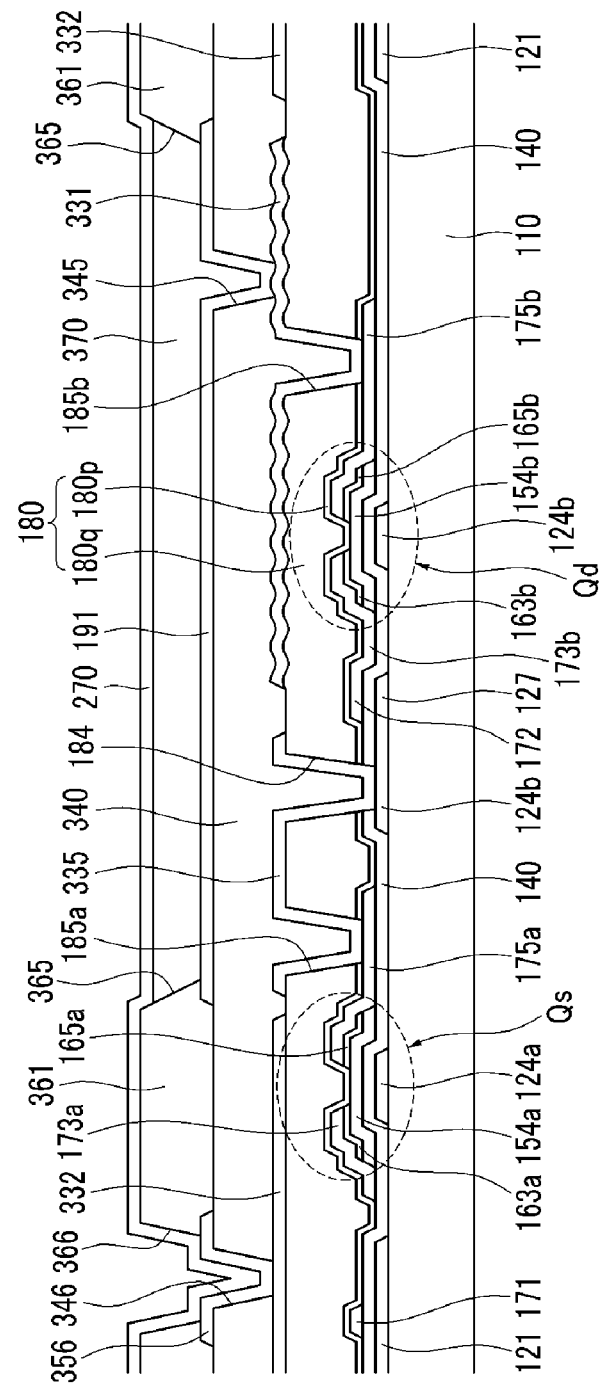
FIG. 5 is a cross-sectional view showing another exemplary embodiment of the OLED display shown in FIG. 2 taken along line IV-IV.

FIG. 2 is a plan view showing an exemplary embodiment of an OLED display, FIG. 3 is a plan view showing an exemplary embodiment of the portion of the OLED display shown in FIG. 2, FIG. 4 is a cross-sectional view showing an exemplary embodiment of the OLED display shown in FIG. 2 taken along line IV-IV, and FIG. 5 is a cross-sectional view showing an exemplary embodiment of the OLED display shown in FIG. 2 taken along line IV-IV.

A gate line 121, including a first control electrode 124a and a second control electrode 124b, is disposed on an insulating substrate 110. The insulating substrate 110 can comprise transparent glass, plastic, or the like, or a combination comprising at least one of the foregoing materials.

The gate line 121 can extend substantially in a transverse direction, and the first control electrode 124a can extend in an upward direction. The gate line 121 may include an end portion (not shown) and a large area for contact with another layer or an external driving circuit.

The second control electrode 124b can be separated from the gate line 121 and include a storage electrode 127, which can extend in a longitudinal direction.

A gate insulating layer 140 may comprise silicon oxide, silicon nitride, or the like, or a combination comprising at least one of the foregoing compounds, and can be disposed on the gate line and the second control electrode 124b.

A first and a second semiconductor islands 154a and 154b may comprise hydrogenated amorphous silicon, or the like, and are disposed on the gate insulating layer 140. The first semiconductor island 154a is disposed on the first control electrode 124, and the second semiconductor island 154b is disposed on the second control electrode 124b.

A first pair of ohmic contacts 163a and 165a are disposed on the first semiconductor island 154a, and a second pair of ohmic contacts 163b and 165b are disposed on the second semiconductor island 154b. The ohmic contacts 163a, 163b, 165a, and 165b can have an island shape and may comprise n+ hydrogenated amorphous silicon, or the like, which is heavily doped with an n-type impurity such as phosphorus, or the like.

A data line 171, a first driving voltage line 172, a common voltage line 332, and a first and a second output electrodes 175a and 175b are disposed on the ohmic contacts 163a, 163b, 165a, and 165b, and on the gate insulating layer 140.

The data line 171 and the first driving voltage line 172 can extend in a longitudinal direction and be substantially perpendicular to the gate line 121. The data line 171 includes a first input electrode 173a, which can extend in a direction towards the first control electrode 124a, and the first driving voltage line 172 can include a second input electrode 173b, which can extend in a direction towards the second control electrode 124b.

The first and the second output electrodes 175a and 175b are separated from each other, as are the data line 171 and the first driving voltage line 172. The first input electrode 173a and the first output electrode 175a oppose each other with respect to the first control electrode 124a, and the second input electrode 173b and the second output electrode 175b oppose each other with respect to the second control electrode 124b.

The ohmic contacts 163a, 163b, 165a, and 165b are disposed between the first and the second semiconductor islands 154a and 154b, which are under the ohmic contacts, and the overlying data line 171, the first driving voltage line 172, and the output electrodes 175a and 175b. The first and the second semiconductor islands 154a and 154b include a portion exposed by the data line 171 and the output electrodes 175a and 175b, including a portion between the input electrodes 173a and 173b and the output electrodes 175a and 175b.

A switching thin film transistor ("TFT") Qs comprises the first control electrode 124a, the first input electrode 173a, the first output electrode 175a, and the first semiconductor island 154a, and a driving thin film transistor Qd comprises the second control electrode 124b, the second input electrode 173b, the second output electrode 175b, and the second semiconductor island 154b.

The structures of the above described switching thin film transistors Qs, driving thin film transistors Qd, gate line 121, data line 171, and first driving voltage line 172 are exemplary, and various other configurations are possible.

A passivation layer 180 is disposed on the data line 171, the first driving voltage line 172, the output electrodes 175a and 175b, and the exposed first and second semiconductor islands 154a and 154b. The passivation layer 180 includes a lower layer (not shown) that may comprise an inorganic insulator such as silicon nitride, silicon oxide, or the like, or a combination comprising at least one of the foregoing inorganic insulators, and an upper layer (not shown) that may comprise an organic insulator. The organic insulator may have a dielectric constant of less than or equal to about 6, specifically less than or equal to about 4, more specifically less than or equal to about 3, and it may be photosensitive and comprise a flat surface. The passivation layer 180 may comprise a single-layered structure, which comprises an inorganic insulator or an organic insulator.

A surface of an upper layer 180q of the passivation layer 180 may be flat, as shown in FIG. 4, or a portion of the surface may comprise at least one of a protrusion and a depression, as shown in FIG. 5.

The passivation layer 180 comprises a plurality of contact holes 185a and 185b, which expose the output electrodes 175a and 175b, and the passivation layer 180 and the gate insulating layer 140 define a first contact hole 184, which exposes the second control electrode 124b.

A reflective electrode 331, a common voltage line 332, and a connection member 335 are disposed on the passivation layer 180. They may comprise a reflective metal including aluminum, silver, chromium, alloys thereof, or the like, or a combination comprising at least one of the foregoing reflective materials.

The reflective electrode 331 is electrically connected to the second output electrode 175b through the contact hole 185b, and the connection member 335 is electrically connected to the second control electrode 124b and the first output electrode 175a through the first and the second contact holes 184 and 185a. As shown in FIG. 5, in an embodiment, a surface of the reflective electrode 331 may comprise at least one of a first protrusion and a first depression, which can have a wave shape, wherein the shape of the first protrusion and the first depression correspond respectively to a second protrusion and a second depression on a surface of the underlying passivation layer 180, if present. The first protrusion and the first depression disposed on the reflective electrode 331 can diffusively reflect light incident on the reflective electrode 331 so that an image of an external object is substantially not observable.

Referring to FIG. 3, the common voltage line 332 comprises a net-like shape, which corresponds to the gate line 121 and the data line 171, and covers the switching thin film transistor Qs. The reflective electrode 331 can occupy substantially all of a region defined by the common voltage line 332, and the connection member 335 can occupy an area covering the first and the third contact holes 184 and 185b. The shape of these elements may have other configurations.

A planarization layer 340 is disposed on the reflective electrode 331, common voltage line 332, the connection member 335, and the passivation layer 180. The planarization layer 340 may comprise an organic material, and comprise a fourth contact hole 345, which exposes the reflective electrode 331, and a fifth contact hole 346, which exposes the common voltage line 332. In FIG. 5, a surface of the reflective electrode 331 includes at least one of the first protrusion and the first depression, but the first protrusion and the depression are covered by the planarization layer 340 thereon such that a flatness of a layer disposed on the planarization layer 340 is not influenced by the protrusion or the depression.

A pixel electrode 191 and a contact assistance member 356 are disposed on the planarization layer 340. The pixel electrode and the contact assistance member may comprise a transparent material, such as indium tin oxide ("ITO"), indium zinc oxide ("IZO"), or the like, or a combination comprising at least one of the foregoing transparent materials. Thus the pixel electrode can be transparent or transflective.

The pixel electrode 191 is electrically connected to the reflective electrode 331 through the fourth contact hole 345, and the contact assistance member 356 is connected to the common voltage line 332 through the sixth contact hole 346.

Referring to FIG. 3, the pixel electrode 191 occupies a substantial portion of the region enclosed by the common voltage line 332 such that the connection member 335 and the reflective electrode 331 are disposed under the pixel electrode 191. Therefore, the area of the pixel electrode 191 is increased relative to a configuration where the pixel electrode 191 is disposed on the same layer as the reflective electrode 331.

A partition 361 is disposed on the planarization layer 340. The partition 361 defines a plurality of openings 365, which enclose an edge of the pixel electrode 191, wherein the edge of the pixel electrode 191 is inclined at a non-perpendicular angle relative to a top surface of the pixel electrode, and the partition 361 includes a seventh contact hole 366, which exposes the contact assistance member 356. The partition 361 may comprise an organic insulator or an inorganic insulator. In an embodiment, the partition 161 may comprise a photosensitive material which includes a black pigment, wherein the partition 361 functions as a light-blocking member. Accordingly, a process for manufacturing the OLED, or an OLED display, may be simplified.

An organic light-emitting member 370 is disposed in the opening 365 defined by the partition 361 on the pixel electrode 190. The organic light-emitting member 370 may comprise an organic material which emits light of one of three primary colors, such as the three primary colors red, green, and blue. The OLED display may display an image by spatially synthesizing light of the primary colors emitted by the organic light-emitting members 370. However, the organic light-emitting member 370 may emit white light and may comprise a structure which includes a plurality of organic material layers for emitting different colors of light among the primary colors. Alternatively, a plurality of color filters (not shown) may be provided on or under the organic light-emitting members 370.

As shown in FIG. 5, wherein a surface of the reflective electrode 331 includes a first protrusion and a first depressions, the bottom of the organic light-emitting members 370 is flat, thus deterioration of an optical characteristic does not substantially occur or is prevented.

A common electrode 270 is disposed on the organic light-emitting member 370. The common electrode 270 substantially covers an entire surface of the substrate 110 and is electrically connected to the contact assistance member 356 through the seventh contact hole 366. The common electrode 270 may comprise a metal including calcium (Ca), barium (Ba), magnesium (Mg), aluminum (Al), silver (Ag), or the like, or a combination comprising at least one of the foregoing metals.

In an OLED display, an organic light-emitting element LD comprises a pixel electrode 190, an organic light-emitting member 370, a common electrode 270, a pixel electrode 190 as an anode, and a common electrode 270 as a cathode.

In the OLED display, the light is emitted upward away from the substrate 110 to display an image, while light emitted from the organic light-emitting members 370 toward the substrate 110 is reflected by the reflective electrode 331 and the connection member 335, and thus is reflected upward.

By configuring the pixel electrode 191 to be separated from the reflective electrode 331 via the planarization layer 340, problems related to an etching ratio or adhesion may be decreased. The reflective electrode 331 may comprise other materials, and various elements such as a thickness, a process margin, and a reflectance may be selected to be different from where a pixel electrode 191 and a reflective electrode 331 contact each other over a larger area.

When the reflective electrode 331, the common voltage line 332, and the connection member 335 are disposed under the pixel electrode 191, the pixel electrode 191 may cover the connection member 335 as well as the reflective electrode 331 such that an aperture ratio is improved.

When the common voltage line 332 is disposed on the same layer as the reflective electrode 331 and the connection member 335, wherein the layer of the reflective electrode 331 is different than the layer of the gate line 121 or the data line 171, the area the common voltage line 332 occupies can be increased such that the common voltage line 332 may be disposed in a desired shape, such as a net-like shape. In an embodiment, the common voltage line 332 can form a rectilinear network.

If the common voltage line 332 is disposed on the same layer as the gate line 121 or the data line 171, the common voltage line 332 must be substantially parallel to the gate line 121 or the data line 171. Further, if the common voltage line 332 is disposed on the same layer as the gate line 121 or the data line 171, and if the common voltage line 332 is to comprise a net-like shape, an additional connection structure for electrically connecting common voltage lines disposed between the gate lines or the data lines would be required, and as a result, the structure becomes complex and difficult to manufacture.

In an exemplary embodiment, the opaque common voltage line 332 does not occupy a separate area, but overlaps the gate line 121 and the data line 171, thereby increasing the aperture ratio. Also, since the common voltage line 332 covers the gate line 121, the data line 171, and the switching thin film transistor Qs, any variation in a voltage of the reflective electrode 331 is substantially reduced or prevented.

Figure 6:
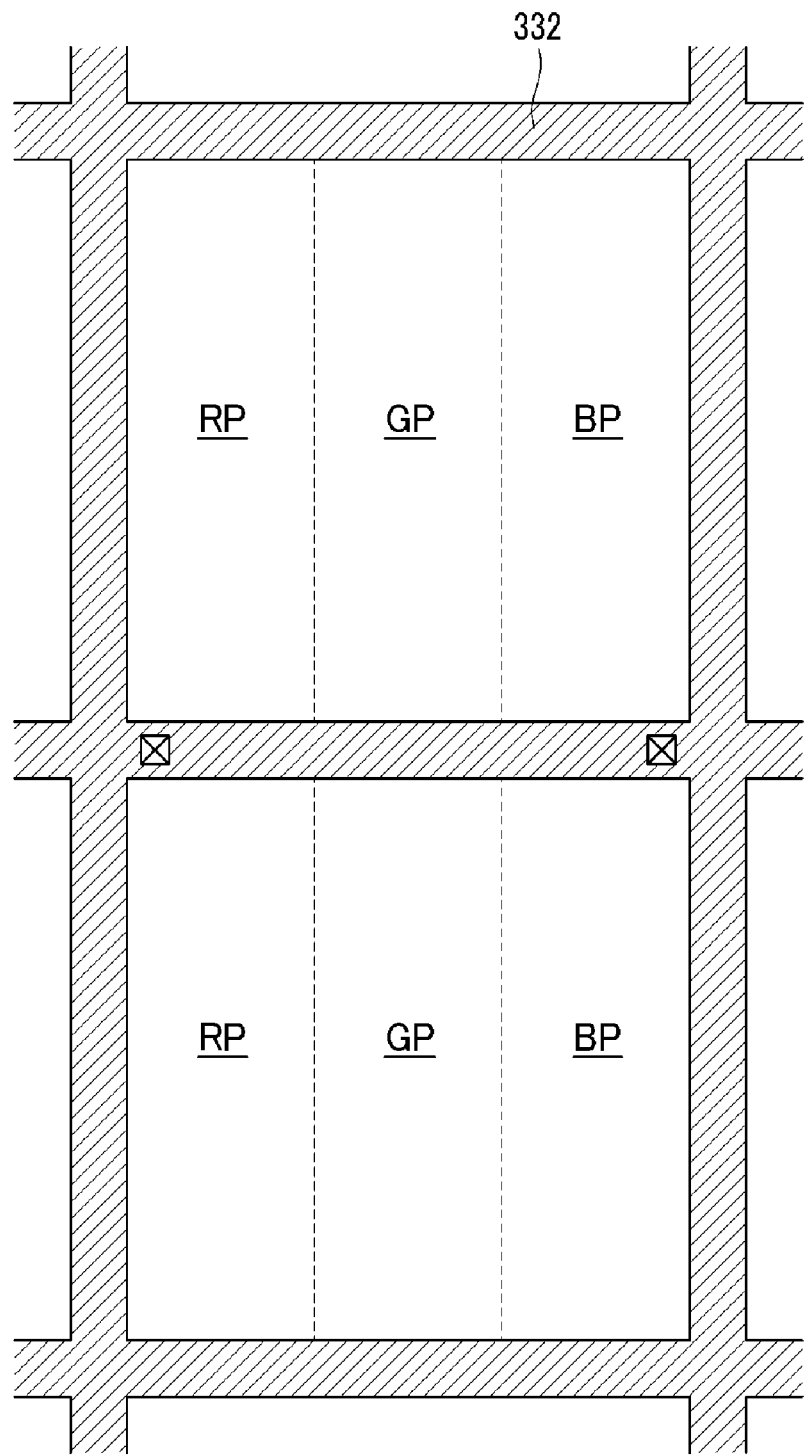
FIG. 6 is a plan view showing another exemplary embodiment of an OLED display.

Alternatively, one mesh in the net of the common voltage line 332 may correspond to several pixels. For example, as shown in FIG. 6, a set pixels comprising a red pixel RP, a green pixel GP, and a blue pixel BP, which are adjacent to each other, may correspond to one mesh. In an embodiment, a single electrical connection between the common electrode 270 and the common voltage line 332 may be disposed for each set of pixels.

A manufacturing method of the OLED display shown in FIG. 2 to FIG. 6 is further described with reference to FIG. 7 to FIG. 16.

FIG. 7 to FIG. 16 are cross-sectional views showing intermediate steps of an exemplary embodiment of a manufacturing process of the OLED display shown in FIG. 2 to FIG. 5.

Figure 7:
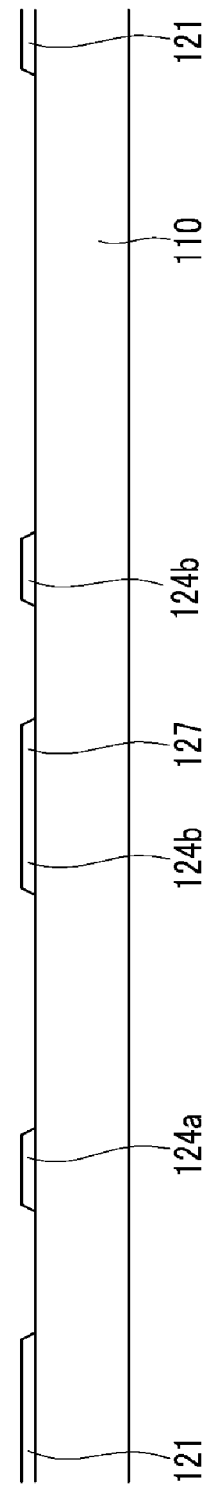
FIG. 7 to FIG. 16 are cross-sectional views showing exemplary embodiments of intermediate steps of a manufacturing process of the OLED display shown in FIG. 2 to FIG. 5.

Referring to FIG. 7, a gate line 121, which includes a first control electrode 124a, and a sustain electrode 127, which includes a second control electrode 124b, are formed on a substrate 110.

Figure 8:
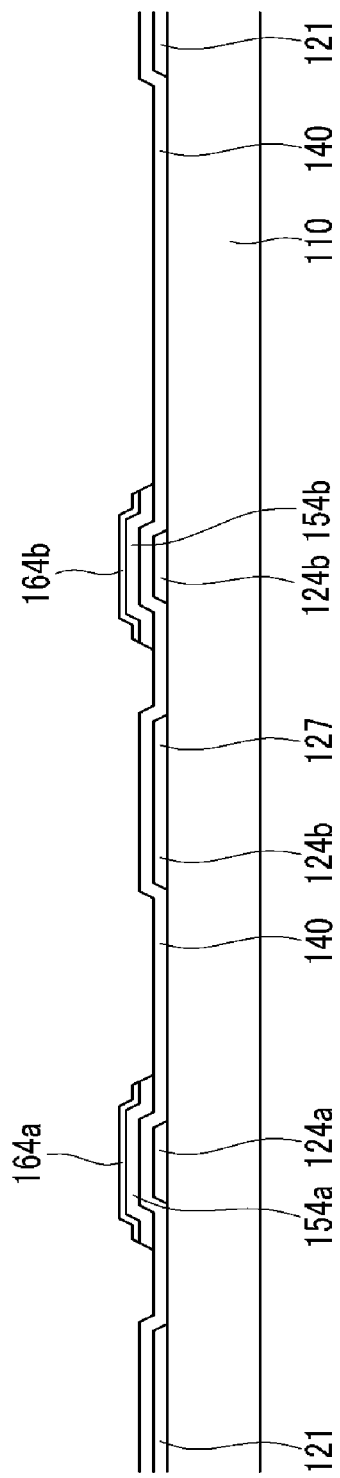

Referring to FIG. 8, a gate insulating layer 140, an intrinsic amorphous silicon layer, and an impurity-doped amorphous silicon layer are sequentially deposited. Then, the impurity-doped silicon layer and the intrinsic amorphous silicon layer are patterned by photolithography, for example, to form a first and a second impurity-doped semiconductor islands 164a and 164b and a first and a second semiconductor islands 154a and 154b.

Figure 9:
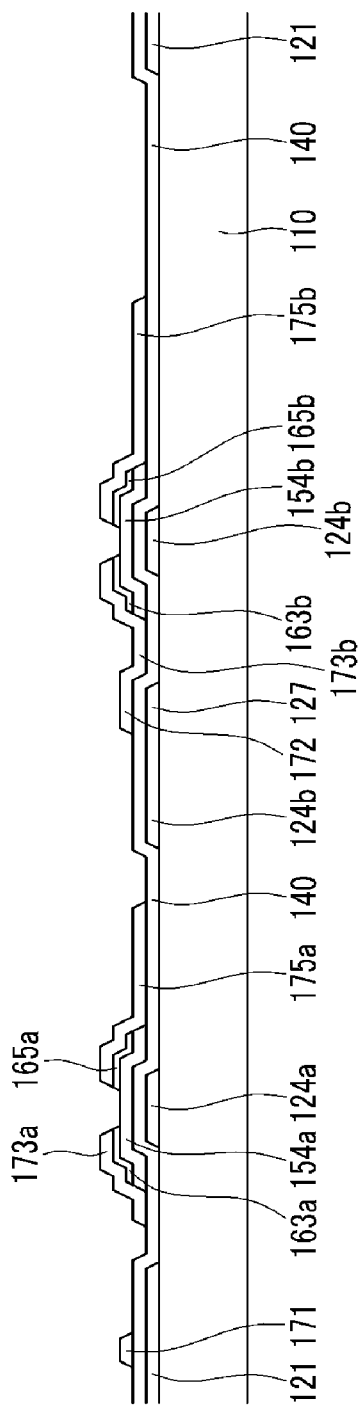

Referring to FIG. 9, a metal layer is deposited and patterned by photolithography, for example, to form a data line 171, which includes first input electrodes 173a, a first driving voltage line 172, which includes a second input electrode 173b, and a first and a second output electrodes 175a and 175b. Next, the exposed portions of the first and the second impurity-doped semiconductors 164a and 164b, which are not covered by the data line 171, the first driving voltage line 172, and the first and the second output electrodes 175a and 175b, are removed to form ohmic contact members 163a, 163b, 165a, and 165b, and expose the first and the second semiconductor islands 154a and 154b thereunder.

Figure 10:
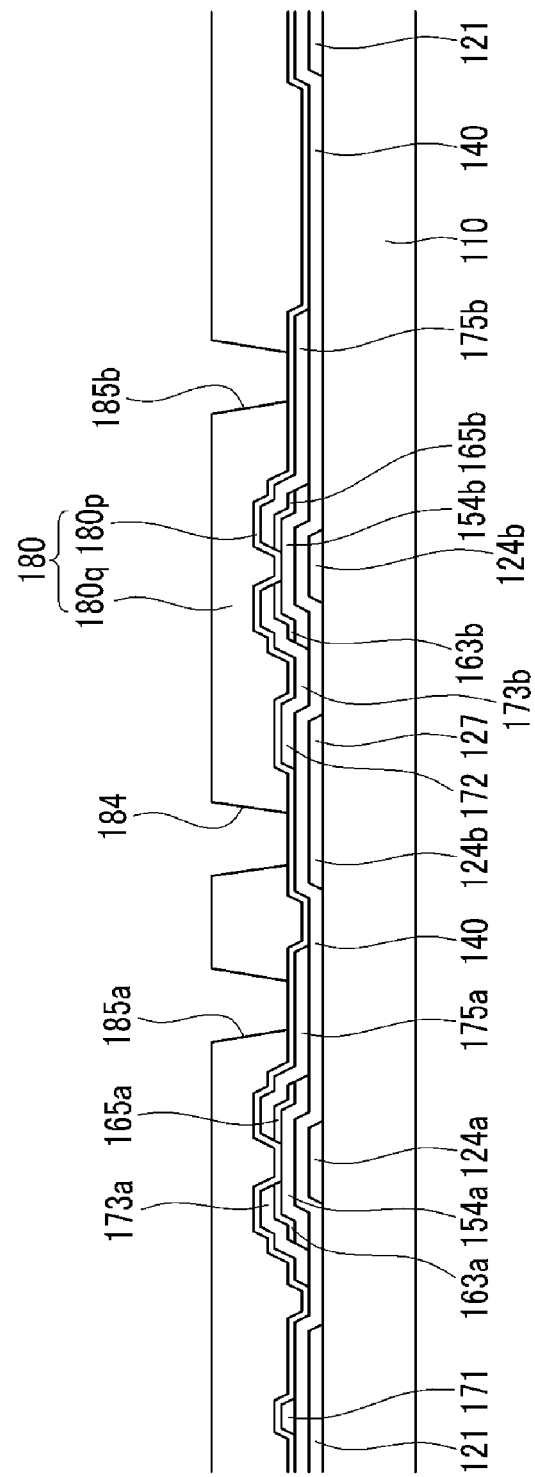
Figure 11:
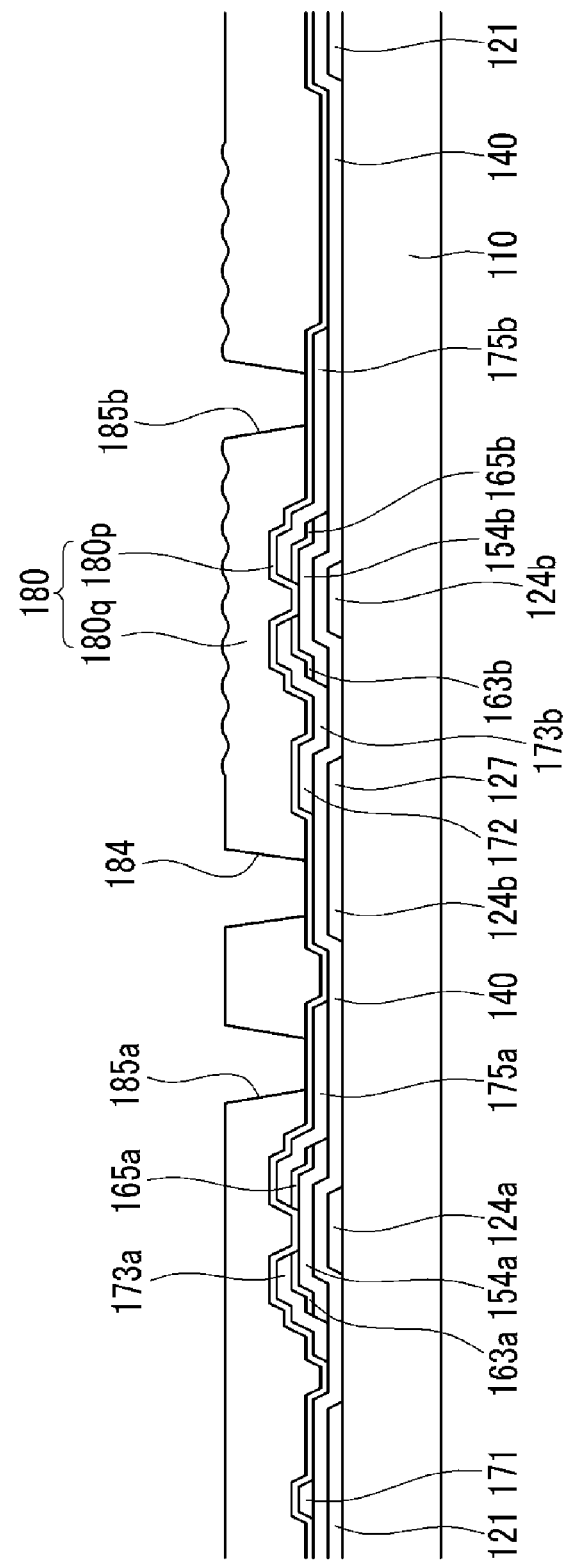

Referring to FIG. 10 and FIG. 11, a lower layer 180p of a passivation layer 180 is deposited, and an upper layer 180q, which comprises a photosensitive organic material, is deposited. Then, the upper layer 180q is exposed, hardened, and developed to form the first, the second, and the third contact holes 184, 185a, and 185b. As shown in FIG. 5, when a surface of the upper layer 180q comprises a protrusion and a depression, a slit mask can be used to form a protrusion and a depression on the desired portion of the upper layer 180q, as is shown in FIG. 11.

Figure 12:
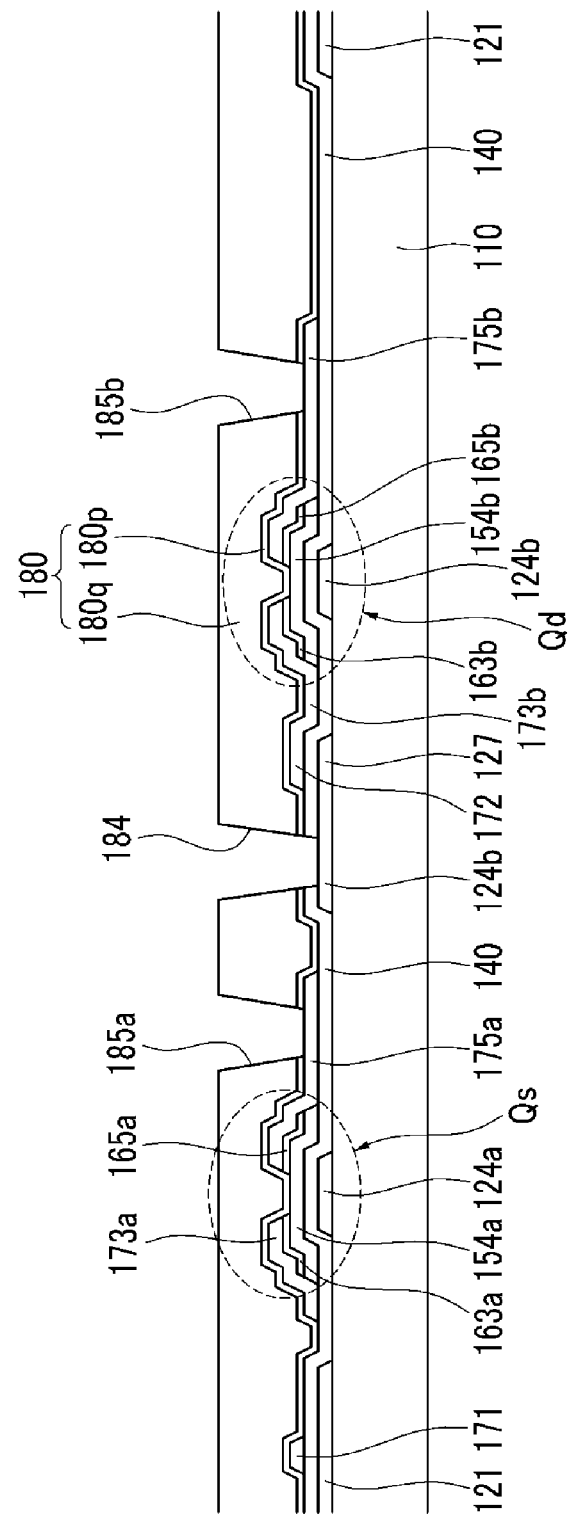

Referring to FIG. 12, the exposed portion of the lower portion 180q is removed using a method such as dry-etching, or the like, to complete formation of the first, the second, and the third contact holes 184, 185a, and 185b.

Figure 13:
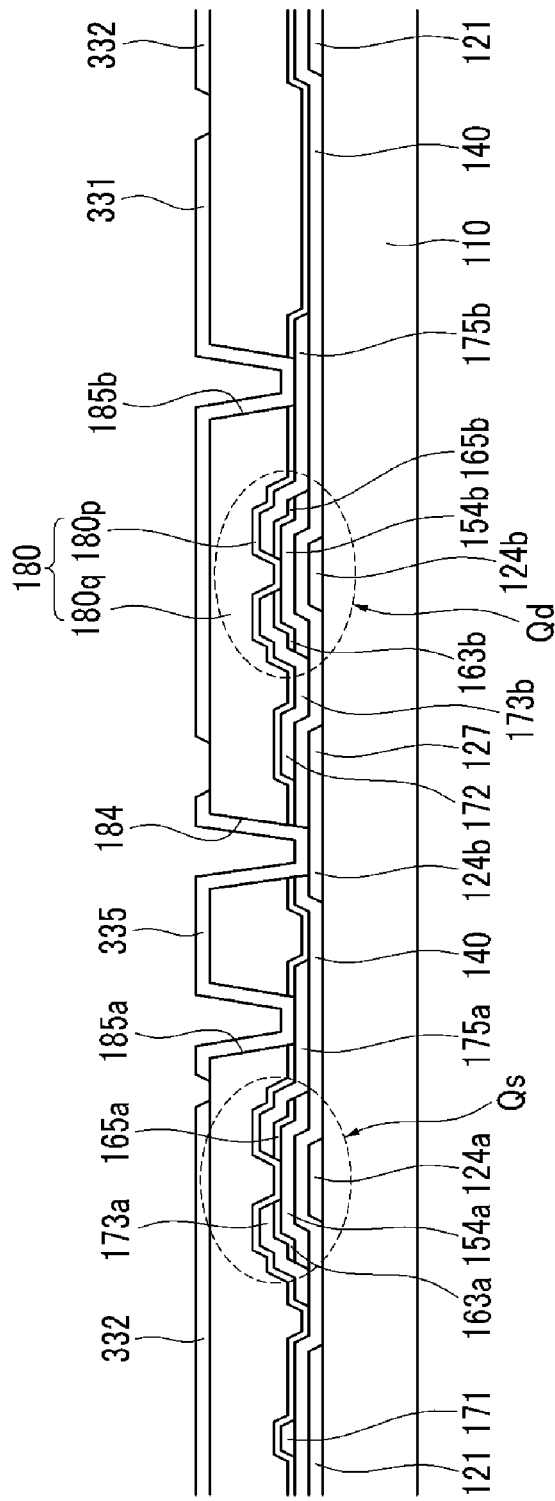

Referring to FIG. 13, a reflective metal, such as aluminum, silver, or the like, or a combination comprising at least one of the foregoing reflective materials, is deposited on the passivation layer 180, and patterned by photolithography, for example, to form a reflective electrode 331, a common voltage line 332, and a connection member 335.

Figure 14:
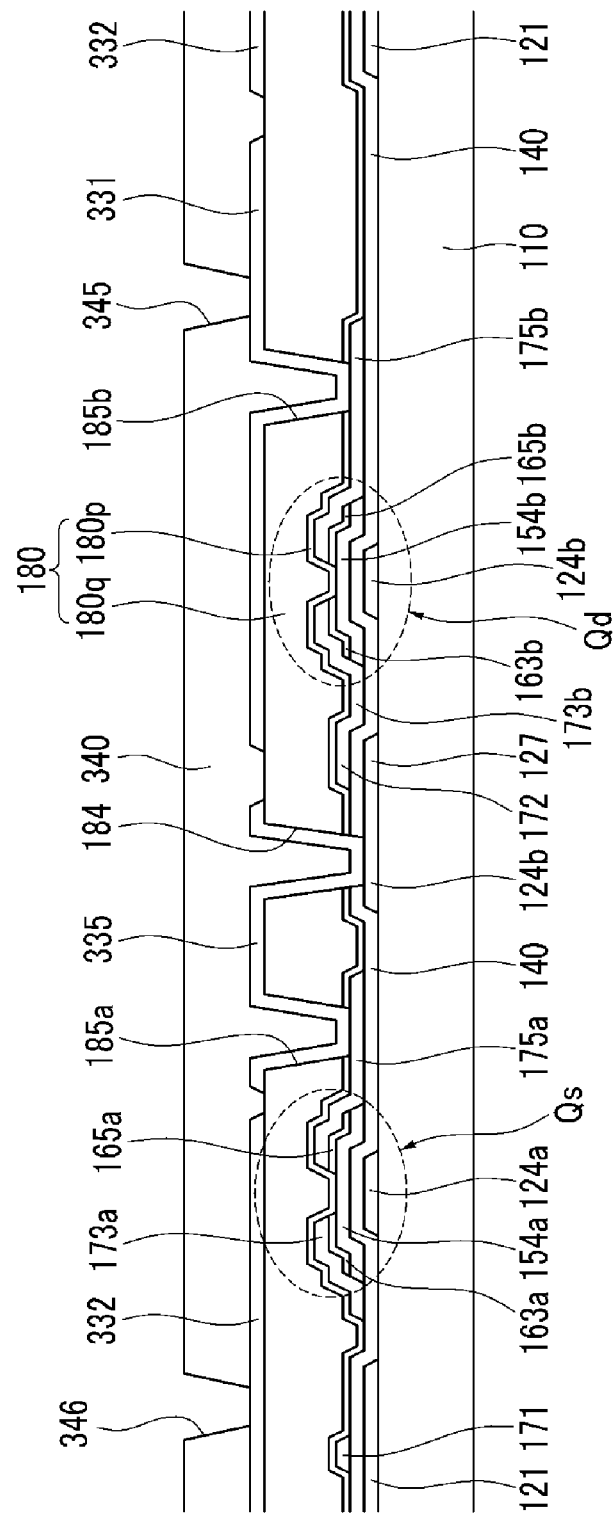

Referring to FIG. 14, an organic layer is formed, which can include depositing, exposing, and developing the organic layer, to form a planarization layer 340 comprising a fourth and a fifth contact holes 345 and 346.

Figure 15:
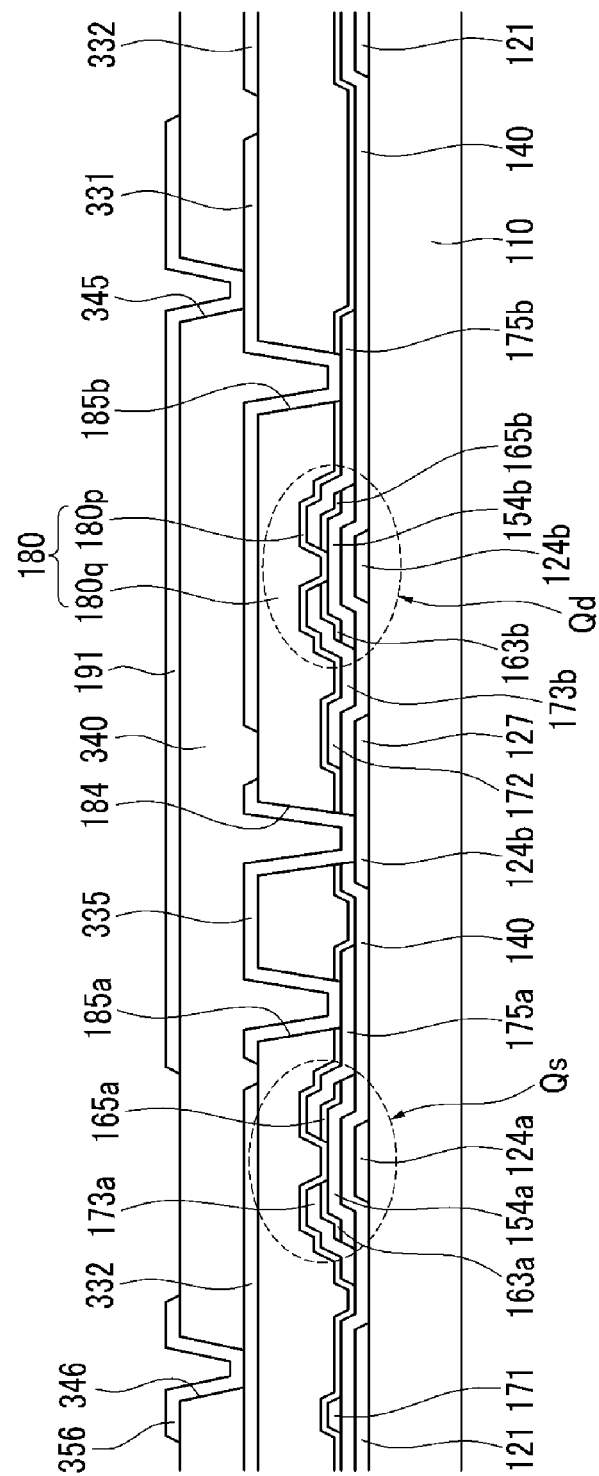

Referring to FIG. 15, a transparent conductive material is deposited and patterned by photolithography, for example, to form a pixel electrode 191 and a contact assistance member 356. In this step, the pixel electrode 191 is electrically connected with the reflective electrode 331 only through the fourth contact hole 345 and substantially or completely covers the reflective electrode 331, such that damage to the reflective electrode from etching the pixel electrode 191 is substantially reduced or prevented. Also, the contact area of the pixel electrode 191 and the reflective electrode 331 is small such that problems relating to cohesion between the pixel electrode 191 and the reflective electrode 331 are reduced.

Figure 16:
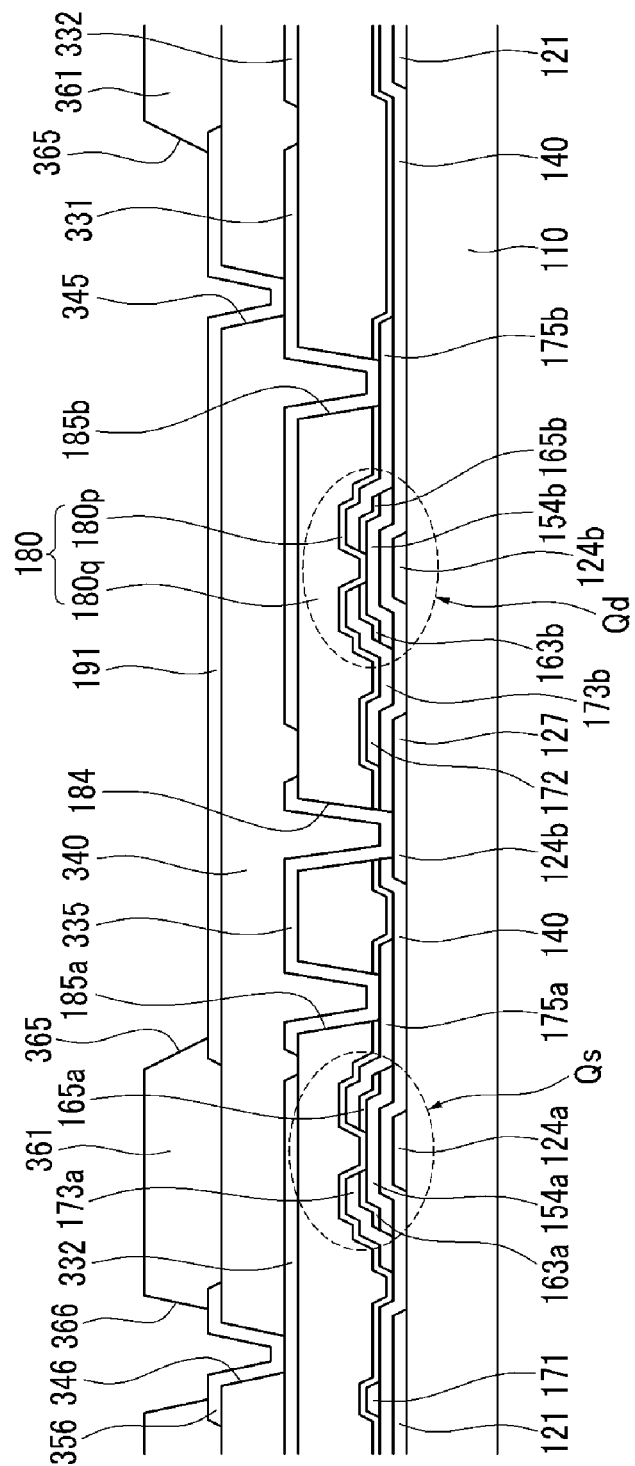

Referring to FIG. 16, an organic material is coated, exposed, and developed to form a partition 361, including opening 365 and seventh contact hole 366.

Next, referring to FIG. 4 and FIG. 5, organic light-emitting member 370 and a common electrode 270 are formed.

An OLED display according to another exemplary embodiment is described with reference to FIG. 17.

Figure 17:
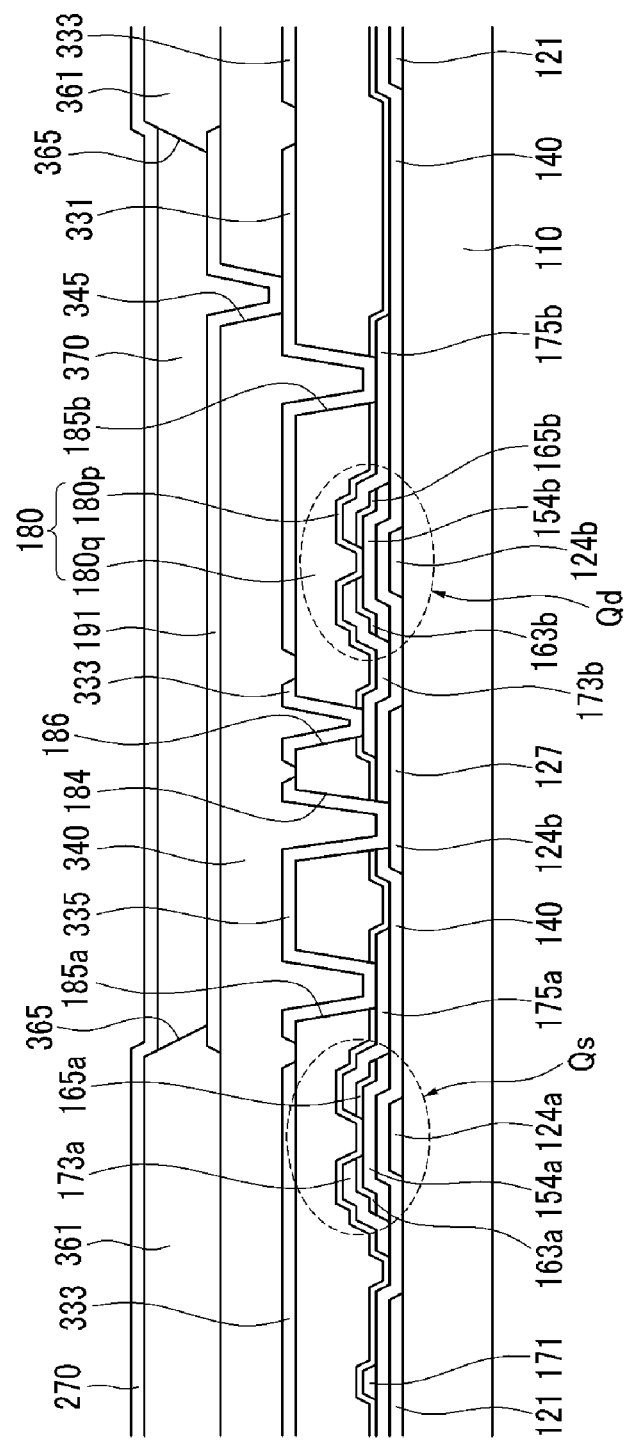
FIG. 17 is a cross-sectional view showing another exemplary embodiment of an OLED display.

FIG. 17 is a cross-sectional view showing another exemplary embodiment of an OLED display.

The OLED display shown in FIG. 17 has substantially the same layered structure as the embodiment of FIG. 4. Specifically a gate line 121, which includes a first control electrode 124a, and a second control electrode 124b, includes a sustain electrode 127, are disposed on a substrate 110, and a gate insulating layer 140 is disposed thereon. The first and the second semiconductor islands 154a and 154b, and the first and the second ohmic contact members 163a, 163b, 165a, and 165b are disposed on the gate insulating layer 140, and data lines 171, including a first input electrode 173a, a second input electrode 173b, and a first and a second output electrodes 175a and 175b are disposed thereon. A passivation layer 180, including a lower layer 180p and an upper layer 180q, are disposed, the passivation layer 180 comprising a contact hole 185a, and the passivation layer 180 and the gate insulating layer 140 comprising a first contact hole 184. A reflective electrode 331 and a connection member 335 are disposed on the passivation layer 180, and a planarization layer 340 including a fourth contact hole 345 is disposed thereon. Pixel electrode 191 is disposed on the planarization layer 340, a partition 361, comprising an opening 365, and an organic light-emitting member 370 are disposed thereon, and a common electrode 370 substantially covers pixel electrode 191, partition 361, and organic light-emitting member 370.

In an embodiment different from that shown in FIG. 4, where the second driving voltage line 333 can be disposed on the same layer as the data line 171, in the OLED display shown in FIG. 17, the second driving voltage line 333 is disposed on the same layer as the reflective electrode 331, and may be simultaneously manufactured with the reflective electrode 331. The second driving voltage line 333 is electrically connected to the second input electrode 173b through the contact hole 186 of the gate insulating layer 140 and the passivation layer 180. However, a connection structure, such as a contact assistance member or a contact hole, as are described in other embodiments for electrically connecting a common voltage line and the common electrode 270, as well as a common voltage lines, are not included.

The contact hole 186 is disposed along with the first, the second, and the third contact holes 184, 185a, and 185b of the passivation layer 180.

According to another embodiment, an additional signal line or voltage line may be disposed on the same layer as the reflective electrode 331, and the exemplary embodiment shown in FIG. 17 can include a second protrusion and a second depression on a surface of the passivation layer 180, and a first protrusion and a first depression on a surface of the reflective electrode 331, as in the exemplary embodiment shown in FIG. 5.

By configuring the pixel electrode 191 to be separated from the reflective electrode 331 via the planarization layer 340, problems related to an etching ratio or adhesion are decreased or substantially eliminated, and the reflective electrode 331 can comprise a larger number of candidate materials, and various elements such as a thickness, a process margin, and a reflectance may be selected to be different from an embodiment where the pixel electrode 191 and the reflective electrode 331 contact each other over a larger area.

Also, the common voltage line is configured in a net-like shape, therefore an electrical resistance may be reduced, and an aperture ratio may be increased.

The invention may also be applied to an OLED display having various other structures.

While this invention has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode display, comprising:
   a first thin film transistor disposed on a substrate;
   a first insulating layer disposed on the first thin film transistor;
   a reflective electrode disposed on the first insulating layer;
   a common voltage line disposed on the first insulating layer and separated from the reflective electrode, the common voltage line transmits a common voltage;
   a second insulating layer disposed on the reflective electrode and the common voltage line;
   a pixel electrode disposed on the second insulating layer and electrically connected to the first thin film transistor, the pixel electrode substantially covering the reflective electrode;
   an organic light-emitting member disposed on the pixel electrode; and
   a common electrode disposed on the organic light-emitting member,
   wherein the common voltage line is electrically connected to the common electrode.

2. The organic light-emitting diode display of claim 1, wherein:
   the second insulating layer has a first contact hole exposing the common voltage line, and
   the common electrode is electrically connected to the common voltage line through the first contact hole.

3. The organic light-emitting diode display of claim 2, further comprising:
   a second thin film transistor disposed under the first insulating layer, and
   a connection member disposed on the first insulating layer and electrically connecting the first thin film transistor and the second thin film transistor.

4. The organic light-emitting diode display of claim 3, wherein:
   the pixel electrode overlaps the reflective electrode and the connection member.

5. The organic light-emitting diode display of claim 4, further comprising:
   a gate line and a data line disposed under the first insulating layer, the gate line and the data line electrically connected to the second thin film transistor, wherein the common voltage line overlaps the gate line and the data line.

6. The organic light-emitting diode display of claim 5, wherein the common voltage line overlaps the second thin film transistor.

7. The organic light-emitting diode display of claim 5, further comprising:
   a contact assistance member disposed on the second insulating layer, the contact assistance member contacting the common voltage line and the common electrode.

8. The organic light-emitting diode display of claim 2, further comprising:
   a second thin film transistor disposed under the first insulating layer;
   a gate line disposed under the first insulating layer; and
   a data line disposed under the first insulating layer, wherein the gate line and the data line are electrically connected to the second thin film transistor, and
   wherein the common voltage line overlaps at least one of the gate line and the data line.

9. The organic light-emitting diode display of claim 8, wherein:
   the common voltage line overlaps both the gate line and the data line.

10. The organic light-emitting diode display of claim 9, wherein:

the common voltage line overlaps the second thin film transistor.

11. The organic light-emitting diode display of claim 2, wherein:
the common voltage line comprises a net-like shape, and the reflective electrode is disposed in a region defined by the net-like shape.

12. The organic light-emitting diode display of claim 2, wherein:
the common electrode comprises a metal.

13. The organic light-emitting diode display of claim 1, wherein:
a surface of the reflective electrode comprises at least one of a first protrusion and a first depression.

14. The organic light-emitting diode display of claim 13, wherein:
a surface of the second insulating layer comprises at least one of a second protrusion and a second depression.

* * * * *